US012642093B2

(12) United States Patent
An et al.

(10) Patent No.: US 12,642,093 B2
(45) Date of Patent: May 26, 2026

(54) POWER ELECTRONICS DEVICE AND POWER ELECTRONICS FUNCTIONAL SYSTEM

(71) Applicant: Schaeffler Technologies AG & Co. KG, Herzogenaurach (DE)

(72) Inventors: Bao Ngoc An, Karlsruhe (DE); Andreas Humbert, Ottersweier (DE); Jens Kroitzsch, Wissembourg (FR)

(73) Assignee: Schaeffler Technologies AG & Co. KG, Herzogenaurach (DE)

( * ) Notice: Subject to any disclaimer, the term of this patent is extended or adjusted under 35 U.S.C. 154(b) by 711 days.

(21) Appl. No.: 17/796,282

(22) PCT Filed: Feb. 3, 2021

(86) PCT No.: PCT/DE2021/100102
§ 371 (c)(1),
(2) Date: Jul. 29, 2022

(87) PCT Pub. No.: WO2021/164814
PCT Pub. Date: Aug. 26, 2021

(65) Prior Publication Data
US 2023/0124909 A1 Apr. 20, 2023

(30) Foreign Application Priority Data
Feb. 19, 2020 (DE) ..................... 10 2020 104 336.8

(51) Int. Cl.
*H10W 70/40* (2026.01)
*B60R 16/02* (2006.01)
(Continued)

(52) U.S. Cl.
CPC ............. *H10W 40/73* (2026.01); *B60R 16/02* (2013.01); *H05K 7/20318* (2013.01);
(Continued)

(58) Field of Classification Search
CPC ............. H01L 23/427; H01L 23/49568; H01L 23/445; B60R 16/02; H05K 7/20318; H05K 7/20327; H05K 7/20936; H10W 40/305
See application file for complete search history.

(56) References Cited

U.S. PATENT DOCUMENTS

| | | | | |
|---|---|---|---|---|
| 4,027,728 A | * | 6/1977 | Kobayashi | .......... F28D 15/0266 174/15.1 |
| 4,950,181 A | * | 8/1990 | Porter | ................... H01L 23/445 361/689 |

(Continued)

FOREIGN PATENT DOCUMENTS

| | | |
|---|---|---|
| CN | 1237056 A | 12/1999 |
| CN | 2673048 Y | 1/2005 |

(Continued)

*Primary Examiner* — Jessica S Manno
*Assistant Examiner* — Andrew Chung
(74) *Attorney, Agent, or Firm* — Suiter Swantz IP

(57) ABSTRACT

A power electronics device comprises a power semiconductor, a first circuit board controllingly connected to the power semiconductor, a lead frame connecting the power semiconductor and the first circuit board. The power semiconductor is connected to at least one contacting region of the lead frame in such a way that heat can be transferred from the power semiconductor to the lead frame and can be conducted away from the lead frame by the power semiconductor. The power electronics device further comprises a housing, which borders at least regions of a fluid reservoir accommodating a coolant fluid. The power semiconductor and the lead frame are arranged in the fluid reservoir and are configured to transfer heat to the coolant fluid.

20 Claims, 6 Drawing Sheets

(51) Int. Cl.
    *H05K 7/20*           (2006.01)
    *H10W 40/73*        (2026.01)

(52) U.S. Cl.
    CPC ..... *H05K 7/20327* (2013.01); *H05K 7/20936*
               (2013.01); *H10W 70/461* (2026.01)

(56)                 References Cited

U.S. PATENT DOCUMENTS

| | | | | |
|---|---|---|---|---|
| 5,040,053 | A * | 8/1991 | Porter | H01L 23/445 |
| | | | | 257/E23.096 |
| 5,455,458 | A | 10/1995 | Quon et al. | |
| 6,233,959 | B1 * | 5/2001 | Kang | H01L 23/445 |
| | | | | 62/3.4 |
| 9,363,930 | B2 | 6/2016 | Kulkarni et al. | |
| 9,560,790 | B2 | 1/2017 | Joshi et al. | |
| 10,149,413 | B1 | 12/2018 | Dede et al. | |
| 2008/0266802 | A1 | 10/2008 | Weiss et al. | |
| 2009/0033410 | A1 | 2/2009 | Nelson et al. | |
| 2021/0153394 | A1 * | 5/2021 | Mitic | B64C 11/00 |

FOREIGN PATENT DOCUMENTS

| | | | |
|---|---|---|---|
| CN | 101276806 | A | 10/2008 |
| CN | 101436819 | A | 5/2009 |
| CN | 102342191 | A | 2/2012 |
| CN | 102468295 | A | 5/2012 |
| CN | 110537257 | A | 12/2019 |
| DE | 102016218817 | A1 | 3/2018 |
| JP | S6074496 | A | 4/1985 |
| JP | 2013179104 | A | 9/2013 |
| KR | 19990088559 | A | 12/1999 |
| WO | 2014131589 | A1 | 9/2014 |

\* cited by examiner

PRIOR ART

PRIOR ART

POWER ELECTRONICS DEVICE AND POWER ELECTRONICS FUNCTIONAL SYSTEM

CROSS-REFERENCE TO RELATED APPLICATIONS

This application is the U.S. National Phase of PCT Appln. No. PCT/DE2021/100102 filed Feb. 3, 2021, which claims priority to DE 102020104336.8 filed Feb. 19, 2020, the entire disclosures of which are incorporated by reference herein.

TECHNICAL FIELD

The present disclosure relates to a power electronics device and a power electronics functional system that ensure cooling of a power semiconductor in a thermally optimized and energy-optimized manner.

The power electronics device and the power electronics functional system can be used in the field of power electronics or assembly and connection technology.

BACKGROUND

Conventional power electronics, as shown by way of example in FIG. 1, usually comprises a power module 3, which is mounted on a cooling element 6, also referred to as a cold plate, and through which a cooling medium 7 flows. Furthermore, it is usually connected to an intermediate circuit capacitor 5 via a busbar 4.

Gate driver circuits and control electronics or a chip 8 are usually arranged on a control circuit board 2 comprising the power electronics.

The structure of a conventional power module 3 is shown in an enlarged view in FIG. 2. It can be seen that here the chip 8 is connected to a base body, also referred to as a baseplate 12, via a bonding wire 9 and a solder layer 10 with an electrical digital control bus (DCB) connection 11 made from a copper-ceramic-copper layer. Thermal paste 13 facilitates the heat transfer from the baseplate 12 to the cooling element 6 and thus to the cooling medium 7.

Further configurations of conventional power electronics and in particular their cooling aspects are explained with reference to the following documents.

U.S. Pat. No. 9,560,790 B2 discloses a cooling system for a motor vehicle. The cooling system comprises a vaporizer, a condenser arranged downstream of the vaporizer, a pump arranged downstream of the condenser, and a two-phase cooling unit arranged downstream of the pump and in series upstream of the vaporizer. The two-phase cooling unit may receive thermal energy from a heat generating device to preheat a working fluid and direct the preheated working fluid to the vaporizer. The heat generating device may be a power electronics device that is thermally coupled to the two-phase cooling unit.

U.S. Pat. No. 9,363,930 B2 discloses a cooling system with a cold plate configured to be contacted with a coolant fluid and to emit vapor phase coolant. Furthermore, the cooling system comprises a heat exchanger which is configured to transfer heat from the coolant vapor to coolant fluid.

U.S. Pat. No. 5,455,458 discloses a cooling device for a power semiconductor arranged together with a substrate in a housing on a heat extraction base. The space inside the housing is filled with a phase change material that absorbs heat at a transition temperature below the critical temperature of the power semiconductor to absorb heat during peak loads. Wires thermally couple the power semiconductor to the phase change material. Heat is extracted from both the semiconductor wafer and the phase change material via a base element.

US 2008/0266802 A1 discloses a technique for cooling connection points in power electronics circuits, such as connection points made by wire bond connections. A phase change heat spreader is thermally coupled at or near the connection point, and a continuous phase change occurs in the heat spreader to extract heat from the connection point during operation. The heat spreader can extend over an area larger than the connection point to improve cooling and dissipate heat over a larger area. It is provided that the phase change is arranged below the component to be cooled or the chip.

WO 2014/131589 A1 discloses a cooling device with converter phase change memories for converter cooling and dissipating heat at power loss peaks. The cooling device comprises a component to be cooled with varying power losses, wherein the component to be cooled comprises a converter module. A cooling element with cooling ribs and a phase change memory are thermally coupled thereto, wherein the cooling element and the phase change memory are thermally connected to one another via at least one heat tube.

However, in the cooling devices presented, which are designed in particular for cooling power electronics devices, there are thermal restrictions such that the heat generated by the power semiconductor cannot be dissipated, or cannot be dissipated in a sufficiently short time, particularly at peak loads despite the surrounding coolant fluid.

To overcome this disadvantage, greatly increased heat transfer surfaces are often implemented in conventional embodiments. However, this leads to a significantly increased installation space requirement, so that power electronics functional systems equipped therewith have a low power density.

In addition, such systems are not scalable in terms of their power. Furthermore, systems known in this field often have an unwanted, what is termed parasitic inductance, which may affect the signals emitted by the power electronics functional unit and/or lead to voltage overshoots when switching.

SUMMARY

An exemplary embodiment of the disclosure provides a power electronics device and a power electronics functional system which ensure cooling of a power semiconductor in a thermally optimized and energy-optimized manner.

In addition, a motor vehicle is provided according to the disclosure, which comprises at least one power electronics device according to the disclosure or a power electronics functional system according to the disclosure.

The features of the disclosure may be combined in any technically useful way, including the explanations from the following description and features from the figures which comprise additional embodiments of the disclosure.

The disclosure relates to a power electronics device comprising at least one power semiconductor and a first circuit board controllingly connected to the power semiconductor.

Furthermore, the power electronics device comprises at least one lead frame, which forms the controlling connection between the power semiconductor and the first circuit board. It is provided according to the disclosure that the power semiconductor is connected to at least one contacting region of the lead frame in such a way that heat can be transferred from the power semiconductor to the lead frame and can be conducted away from the lead frame by the power semiconductor. In this case, the power electronics device also comprises a housing which borders at least regions of a fluid reservoir in which a coolant fluid is/can be accommodated. A respective power semiconductor and a respective lead frame are arranged in the fluid reservoir for the purpose of transferring heat from the respective power semiconductor and/or from the respective lead frame to the coolant fluid.

The present power electronics device is a device for implementing power electronics.

The power semiconductor can also be referred to as a chip and has the function of a switching device. A control unit which is also comprised by the power electronics device and which, in one embodiment, can be formed from a microcontroller and a gate driver, is configured to feed signals to the power semiconductor via the circuit board. The power semiconductor then carries out switching processes on components to be controlled, such as on an electric motor or the corresponding phase of the electric motor, by transmitting electrical signals.

In particular, the power semiconductor can be connected to the lead frame by means of sintering or soldering. In this case, the power semiconductor can be connected to the lead frame via what is termed the underside of the chip. Likewise, the connection between the lead frame and the circuit board can be realized by sintering or soldering.

An electrical power supply can be realized in particular via a battery connected to the circuit board, which supplies the circuit board, the lead frame and the power semiconductor with current via an intermediate circuit capacitor.

Electrical current provided by the battery can be routed via the circuit board and high-current contacts to operate the components.

The control unit itself can be arranged outside of the space bordered by the housing, in particular on the circuit board and controllingly connected to it.

The intermediate circuit capacitor can also be arranged on the circuit board.

What is termed the lead frame is a solderable metallic conductor support in the form of a frame or comb, which is designed in particular for use on semiconductor chips. In addition to a contacting region for contacting the power semiconductor, such a lead frame comprises a plurality of line elements extending from the contacting region, which in turn are configured for making electrical contact with other electronic components, in particular with the circuit board.

In the present disclosure, the lead frame thus fulfills the function of what is known as a "heat spreader", i.e., a heat distributor. In addition, heat is also absorbed by the power semiconductor via the circuit board and transferred from the circuit board to the coolant. Furthermore, the lead frame is used for making electrical contact with the circuit board, in particular via what is termed its "drain" connection.

The circuit board is in particular what is termed a high-current printed circuit board (PCB).

The housing and thus also the coolant fluid contained in the reservoir surround the respective power semiconductor and the respective lead frame.

The fluid reservoir designates a fluidically closed space which is used to hold the coolant fluid.

Regardless of the possible variants with regard to the number of power semiconductors and lead frames, these are arranged in the fluid reservoir according to the disclosure.

In particular, it is provided that the coolant fluid is an inert and/or electrically insulating fluid with respect to the components it dampens.

The unit made up of the circuit board, lead frame and at least one power semiconductor can also be referred to as a half-bridge module.

A power semiconductor can thus be optimally cooled with the power electronics device according to the disclosure, so that it can be operated with a correspondingly high electrical power.

The structure of the power electronics device according to the disclosure has a low parasitic inductance. Furthermore, only low electrical resistances need to be overcome. In addition, it can be seen that no expensive and/or heavy materials such as ceramics need to be used for the construction of the power electronics device according to the disclosure.

In a development of the power electronics device, it is provided that the power electronics device comprises at least one further power semiconductor and at least one further lead frame, which forms the controlling connection between the further power semiconductor and the first circuit board, wherein the further power semiconductor is connected to at least one contacting region of the further lead frame in such a way that heat can be transferred from the further power semiconductor to the further lead frame and can be conducted away from the further lead frame by the further power semiconductor, and wherein the further power semiconductor and the further lead frame are arranged on the opposite side of the first circuit board to the power semiconductor and the lead frame.

The disclosure is not limited to the fact that only one power semiconductor and lead frame are arranged on the circuit board, but several power semiconductors and lead frames can be arranged according to the disclosure on both sides of the circuit board.

It can also be provided here that the further power semiconductor is connected to the contacting region of the further lead frame at a side facing away from the first circuit board.

In the embodiment with only one power semiconductor and one lead frame, the housing is sealed off from the first circuit board. Correspondingly, the first circuit board is used here to delimit the fluid reservoir. For the purpose of sealing, an extra seal can be arranged between the housing and the respective circuit board or circuit board side.

Vertical electrical connections, which are termed vias, can be used to connect high-current contacts to the circuit board, which themselves have a sealing effect on the high-current contacts and the circuit board, so that no additional sealing against the coolant fluid is required here.

By using the circuit board as part of the seal of the fluid reservoir, the electrical contacting of the power semiconductors to the outside can be realized via the vias on the circuit board and via the high-current contacts. The high-current contacts can be soldered onto the circuit board at the via points. It is therefore not necessary to seal the high-current contacts.

For the purpose of efficient heat dissipation, line elements of the respective lead frame can form a total heat transfer surface Ag for transferring heat to the coolant fluid, which in relation to a connection surface Ac of the respective lead frame, on which the respective lead frame contacts the respective power semiconductor, results in the following ratio: $Ag/Ac > 1$.

This means that the total heat transfer area, which is realized by the line elements of the respective lead frame, is at least as large as the contacting region. In an embodiment of the power electronics device, the total heat transfer surface is significantly larger, i.e., at least twice as large as the contact surface.

This area ratio ensures optimal distribution of the heat generated by the respective power semiconductor and consequently optimal heat dissipation and cooling of the respective power semiconductor.

What is termed an optimal heat spreading effect is thus achieved.

In an embodiment it is provided that an area on the first circuit board defined by end regions of the line elements of the respective lead frame is at least twice as large as the area of the respective power semiconductor which faces the first circuit board.

In particular, the level of attachment of the respective lead frame to the respective power semiconductor can have a spacing between the first circuit board.

This enables optimal heat transfer from the respective lead frame to its surroundings or to the coolant fluid due to the fact that large areas of its line elements can be completely contacted by the coolant fluid.

This is also realized in particular when the power semiconductor is fastened to the lead frame at a side facing away from the first circuit board.

In particular, it can be provided that a direct electrical connection is formed between the power semiconductor and the circuit board on the side of the power semiconductor opposite the lead frame. This means that the power semiconductor is electrically coupled to the circuit board both directly and indirectly via the lead frame.

This is achieved in particular by electrically conductive layers on the two contacting sides of the power semiconductor.

A further embodiment provides that the first circuit board is electrically coupled to a second circuit board, wherein the first circuit board with the power semiconductors and lead frames arranged thereon is positioned in such a way that the further lead frame has a spacing between the second circuit board.

This serves in particular to ensure that the second lead frame is not covered but can be contacted by the coolant to the greatest possible extent for the purpose of efficient heat dissipation.

In the embodiment with at least two power semiconductors and two lead frames, the housing is sealed off from the second circuit board, which is electrically connected to the first circuit board. Accordingly, the second circuit board is used here to delimit the fluid reservoir. The electrical coupling of the second circuit board to the first circuit board takes place in particular via additional high-current contacts.

In addition to the function of delimiting the fluid reservoir, the second circuit board also has the function of making contact with the outside, in particular with an intermediate circuit capacitor.

In addition, the power electronics device can further comprise a condensing unit, which is configured to cool and thus condense vaporized coolant fluid and in turn to provide it for cooling the respective power semiconductor and/or the respective lead frame.

This ensures that the heat from vaporization can also be dissipated. The coolant fluid is thus guided in a thermal circuit.

For this purpose, the condensing unit can have a receiving space for accommodating a cooling medium, in particular for a cooling medium to flow through, wherein the condensing unit is configured to absorb heat from vaporized coolant fluid and to transfer it to the cooling medium in the receiving space. This creates a closed system of high-performance two-phase cooling. Accordingly, the power electronics device is designed with a heat exchanger function in this embodiment.

Furthermore, the condensing unit can have projections, in particular ribs, formed in the direction of the fluid reservoir, wherein the receiving space for accommodating the cooling medium extending at least in regions into these projections. The heat transfer surface of the condensing unit is thus significantly increased by these projections, which are designed in particular in the form of ribs. Due to the fact that the receiving space extends into the projections, there is an optimal heat transfer from the projections to the cooling medium in the projections, so that the condensing unit can be efficiently cooled by the cooling medium and the vaporized coolant fluid can be cooled with corresponding efficiency and consequently condensation of the coolant fluid can be achieved.

A further aspect of the present disclosure is a power electronics functional system which comprises a plurality of power electronics devices according to the disclosure, wherein the power electronics devices are connected to lines for different voltage phases. In particular, the power electronics functional system can be designed in such a way that several power electronics devices according to the disclosure are mounted on a high-current-carrying conducting element, such as on a multi-layer copper sheet, and are interconnected to form a multi-phase power electronics system.

A very low-inductance, low-impedance high-current connection can be implemented between the individual power electronics devices.

In particular, each power electronics device according to the disclosure can be coupled to a phase of an AC voltage. Due to the possible configuration of the power electronics devices as modules, the power electronics functional system can be scaled correspondingly easily with regard to the output current and the output power.

Heat can still be efficiently dissipated to the surrounding environment over a large area of the high-current-carrying conducting element or the multi-layer copper sheet.

Furthermore, shielding can be implemented in order to achieve sufficient electromagnetic compatibility.

The present disclosure is supplemented by a motor vehicle, in particular a motor vehicle that can be driven at least partially by an electric motor, which comprises at least one power electronics device according to the disclosure and/or at least one power electronics functional system according to the disclosure and a cooling medium circuit which is fluidically coupled to the condensing unit of the respective power electronics device.

Correspondingly, a cooling medium used in a motor vehicle for other purposes, such as a water-glycol mixture, can be supplied to the power electronics device according to the disclosure and the power electronics device can thus be integrated into the overall cooling circuit of the motor vehicle.

BRIEF DESCRIPTION OF THE DRAWINGS

The disclosure described above is explained in detail below based on the relevant technical background with reference to the associated drawings. The disclosure is in no way restricted by the purely schematic drawings, wherein it should be noted that the exemplary embodiments shown in the drawings are not limited to the dimensions shown. In the drawings.

DETAILED DESCRIPTION

Figure 1:
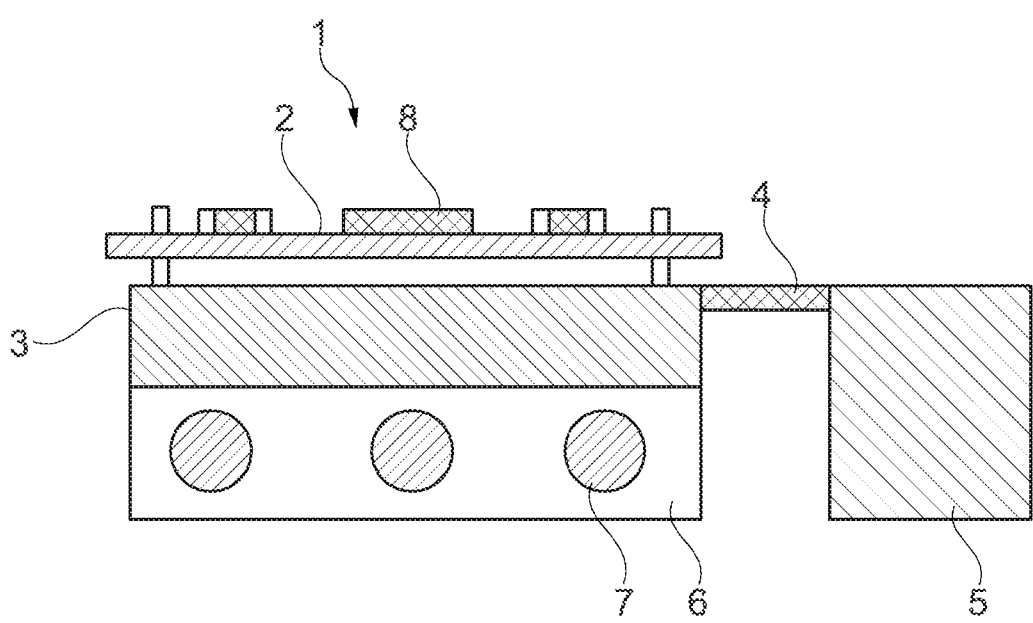
FIG. 1: shows power electronics with a conventional structure.
Figure 2:
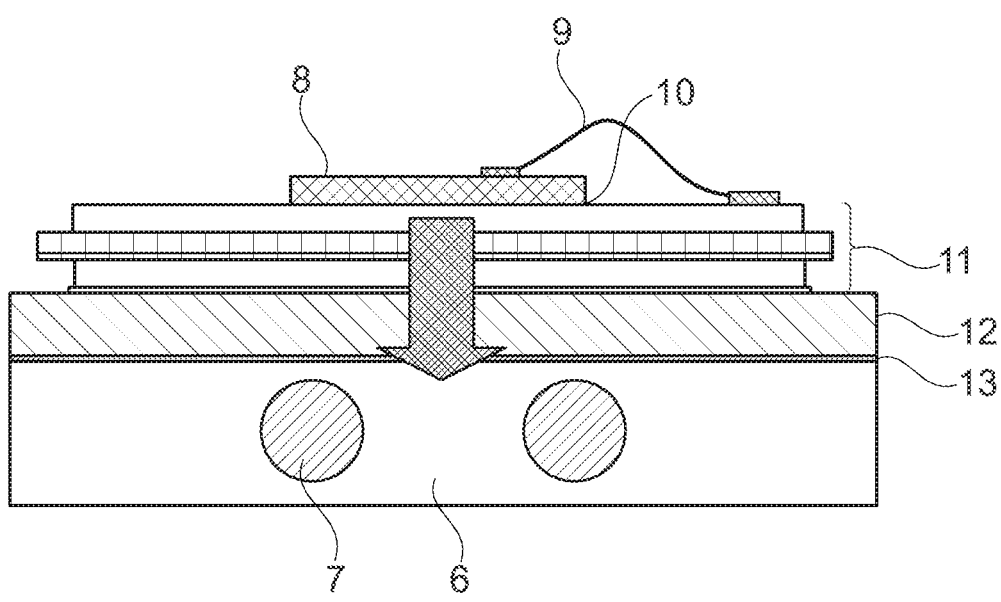
FIG. 2: shows an enlarged view of the region of the electrical connection of the chip according to the embodiment according to FIG. 1, FIG. 3: shows power electronics according to the disclosure in a sectional view.

FIGS. 1 and 2 have already been discussed in order to explain the prior art.

Figure 3:
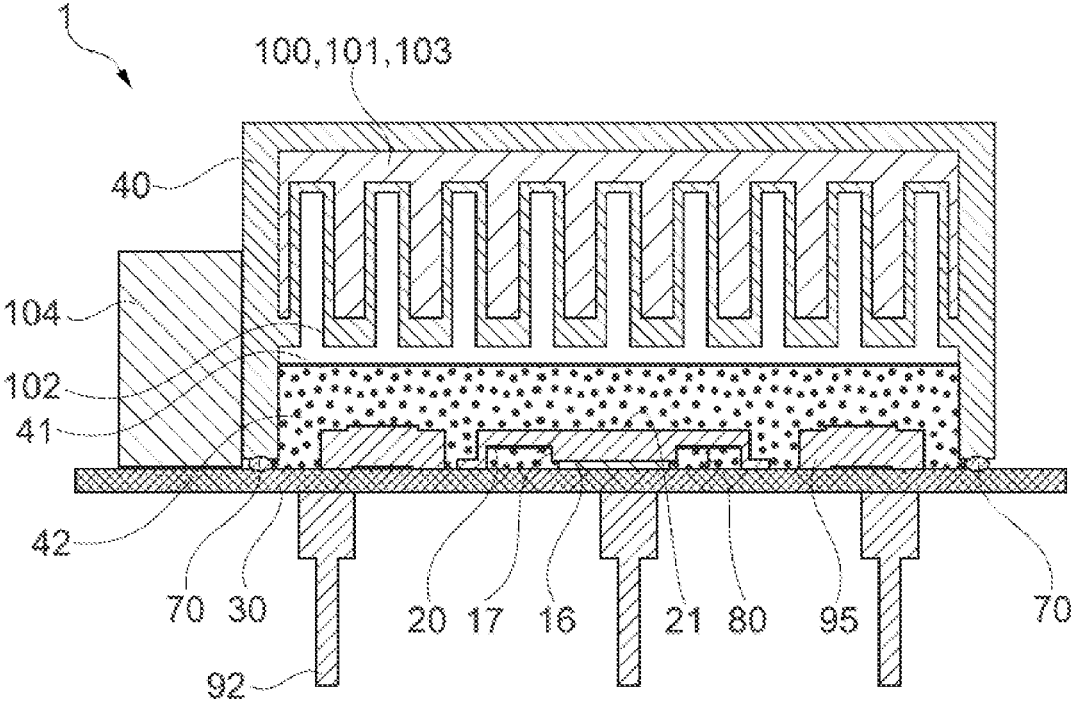

FIG. 3 shows a first embodiment of a power electronics device 1 according to the disclosure.

This includes a power semiconductor 16, which can also be referred to as a chip. The chip or the power semiconductor 16 is electrically conductively connected to a lead frame 20 via its underside 17, which is oriented upwards in the embodiment shown here. It can be seen that the contacting region 21 between the power semiconductor 16 and the lead frame 20 is significantly smaller than the total area formed by the lead frame 20, so that heat introduced into the lead frame 20 by the power semiconductor 16 can be distributed by the lead frame 20 over its large surface. The lead frame 20 is in turn electrically connected to a first circuit board 30. Correspondingly, heat is also transferred from the lead frame 20 to the first circuit board 30. The power semiconductor 16 and the lead frame 20 are arranged within a fluid reservoir 41 delimited by a housing 40. Coolant fluid 42 is present in this fluid reservoir 41 and completely surrounds the power semiconductor 16 and the lead frame 20. Correspondingly, heat can be transferred from the power semiconductor 16 to the coolant fluid 42 over the large area of the lead frame 20 and the power semiconductor 16 is correspondingly effectively cooled.

The first circuit board 30 is therefore designed to be multifunctional, since it is used for contacting the power semiconductor 16 and for electrical contacting to the outside, and at the same time also for delimiting the fluid reservoir 41 in regions.

The power electronics device 1 also comprises a condensing unit 100, which forms a receiving space 101 in which a cooling medium 103 is arranged. For the purpose of enlarging the surface of the condensing unit 100, projections 102 are provided in the direction of the first circuit board 30, which are part of the receiving space 101 and are correspondingly filled with cooling medium 103.

If the coolant fluid 42 vaporizes due to the temperature, it reaches the condensing unit 100 in vapor form. Due to the fact that this is kept at a low temperature by the cooling medium 103, the coolant fluid vapor 42 condenses, so that the liquefied coolant fluid 42 in turn drips off the projections 102 and is fed to the fluid reservoir 41 for the purpose of once again cooling the power semiconductor 16 or the lead frame 20. The cooling medium 103 of the condensing unit 100 can be fluidically connected to another circuit, such as a cooling system of a motor vehicle, so that it can also be cooled via a heat exchanger, not shown here, and can be fed back to the aforementioned condensation purpose.

In the embodiment shown here, the power electronics device 1 also comprises what is termed a DC link capacitor 104 for connecting it to a DC network.

In an alternative embodiment, the DC link capacitor 104 can also be mounted on the housing 40 via a press connection when the power electronics device 1 is mounted.

What is termed a snubber capacitor 95 is also arranged in an electrically conductive manner on the first circuit board 30 for the purpose of damping voltage peaks.

There is a spacing 80 between the lead frame 20 and the first circuit board 30. In the embodiment shown here, the spacing 80 is arranged in such a way that the power semiconductor 16 rests with its side facing away from the lead frame 20 and consequently with its upper side on the first circuit board 30 and makes electrically conductive contact therewith. In this way, heat can be transferred directly from the power semiconductor 16 to the first circuit board 30.

A seal 70 is arranged between the housing 40 and the circuit board 30. The electrical signals or the electrical power supply are transmitted or implemented by high-current contacts 92 which are coupled to the first circuit board 30.

Figure 4:
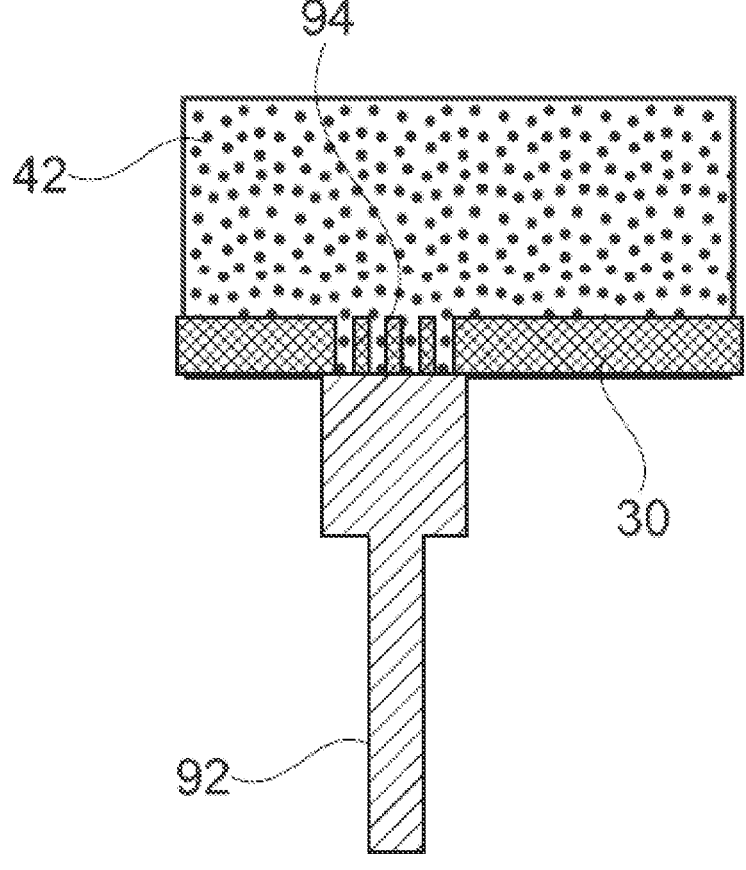
FIG. 4: shows the region of the connection of high-current contacts of a high-current contact according to the embodiment shown in FIG. 3, FIG. 5: shows a further embodiment of power electronics according to the disclosure in a sectional view.

This connection can be seen in an enlarged view in FIG. 4.

It can also be seen here that a respective high-current contact 92 is electrically conductively connected to the first circuit board 30 by means of what is termed a respective via 94. The via 94 also ensures a fluid seal against the coolant fluid 42 at the same time that it is passed through the circuit board 30.

Figure 5:
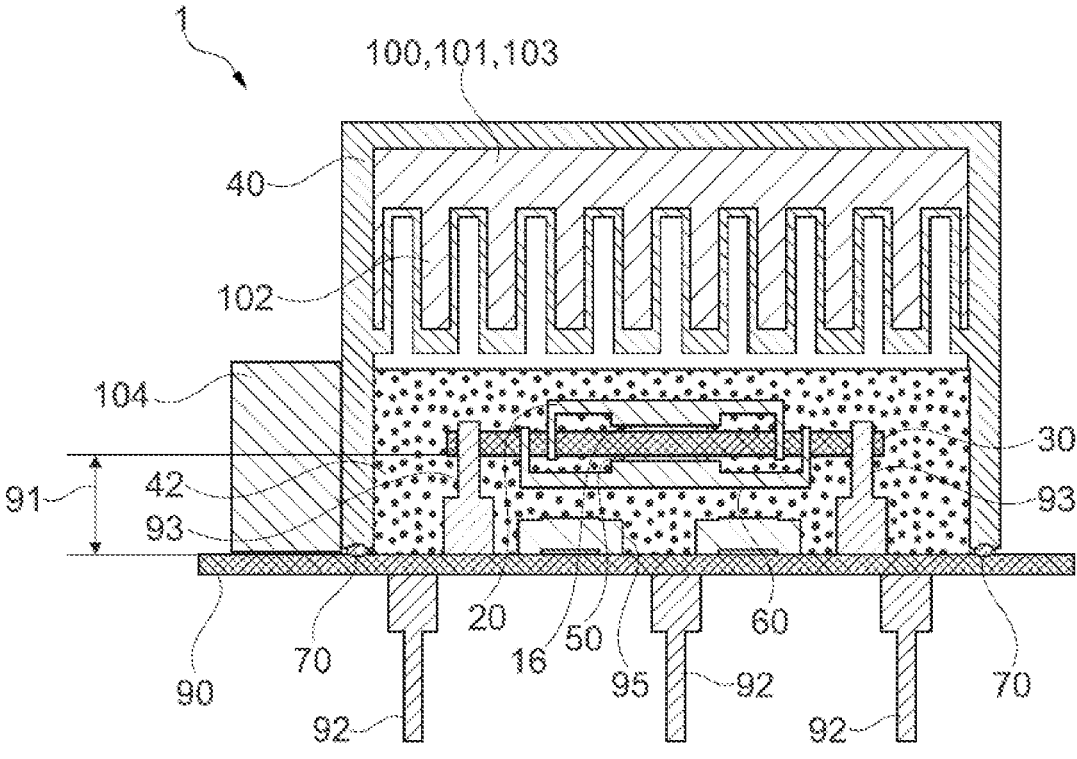

FIG. 5 shows a further embodiment of the power electronics device 1 according to the disclosure.

This differs from the embodiment shown in FIG. 3 essentially in that a further power semiconductor 50 and a further lead frame 60 are arranged on the side of the first circuit board 30 opposite the power semiconductor 16 and the lead frame 20. Similarly to the power semiconductor 16 and the lead frame 20, and thus likewise the further power semiconductor 50 and the further lead frame 60 are completely surrounded by the coolant fluid 42. This is ensured by a spacing 91 between the first circuit board 30 and a second circuit board 90 which, together with the housing 40, borders the fluid reservoir 41.

The connection between the first circuit board 30 and the second circuit board 90 is implemented here via additional high-current contacts 93. As in the first embodiment shown in FIG. 3, the power electronics device 1 is electrically connected via high-current contacts 92, however, these are connected to the second circuit board 90 in the embodiment shown here.

The embodiment shown in FIG. 5 thus has the advantage that two power semiconductors 16, 50 can be cooled at the same time in a very space-efficient manner by a coolant fluid 42 that condenses on a common condensing unit 100.

Figure 6:
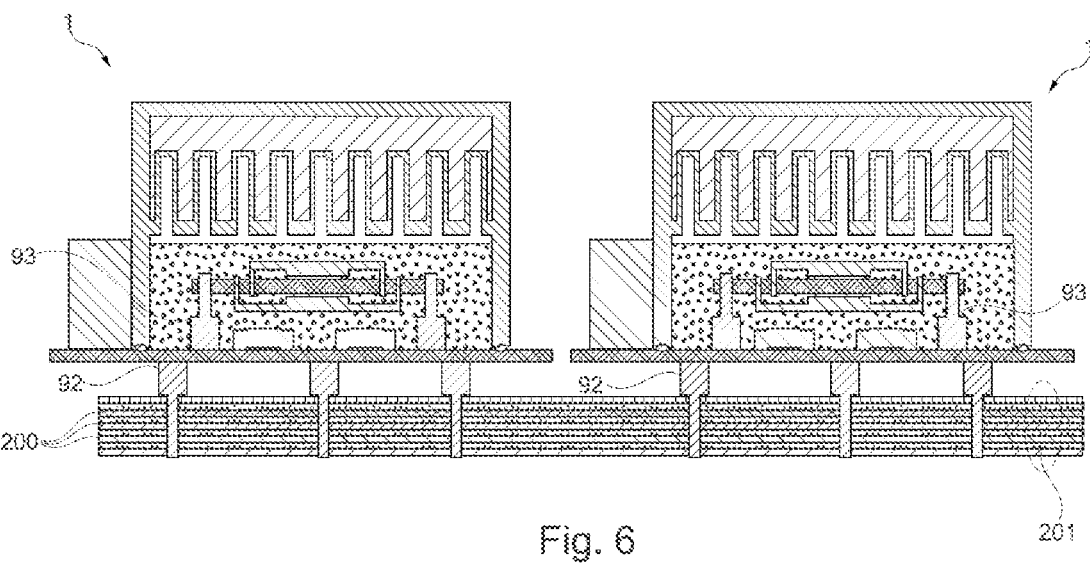
FIG. 6: shows a power electronics functional system according to the disclosure with several power electronics devices according to the disclosure.

FIG. 6 shows a power electronics functional system according to the disclosure, which comprises several power electronics devices 1 according to the disclosure. The power electronics devices 1 are connected via the high-current contacts 92 to current-carrying lines 200, which can in particular be copper sheet layers, via which heat can also be dissipated. For example, one phase of a three-phase motor is connected to the output of the power electronics functional unit, here at the AC connection. Power electronics functional units are therefore connected to a three-phase motor of the type usual in an electric drive system.

The power electronics device and the power electronics functional system enable a power semiconductor to be cooled in a thermally optimized and energy-optimized manner, so that it can be designed for high performance.

LIST OF REFERENCE SYMBOLS

1 Power electronics device
2 Control circuit board
3 Power module
4 Busbar
5 Intermediate circuit capacitor
6 Cooling element
7 Cooling medium
8 Chip
9 Bonding wire
10 Solder layer
11 DCB
12 Base plate
13 Thermal paste
16 Power semiconductor
17 Underside of the chip
20 Lead frame
21 Contacting region
30 First circuit board
40 Housing
41 Fluid reservoir
42 Coolant
50 Further power semiconductors
60 Further lead frames
70 Seal
80 Spacing
90 Second circuit board
91 Spacing between the first circuit board and the second circuit board
92 High-current contact
93 Further high-current contact
94 Via
95 Snubber capacitor
100 Condensing unit
101 Receiving space
102 Projection
103 Cooling medium
104 DC link capacitor
200 Current-carrying lines/layers
201 AC phase output

The invention claimed is:

1. A power electronics device, comprising:
a power semiconductor, the power semiconductor being a switching device;
a first circuit board controllingly connected to the power semiconductor;
a lead frame connecting the power semiconductor and the first circuit board, wherein the power semiconductor is connected to at least one contacting region of the lead frame in such a way that heat can be transferred from the power semiconductor to the lead frame and can be conducted away from the lead frame by the power semiconductor, wherein the power semiconductor is disposed between the first circuit board and the lead frame, wherein the power semiconductor is directly connected to the first circuit board and the lead frame on opposing sides of the power semiconductor, the power semiconductor being configured to transfer heat directly to the first circuit board and the lead frame, the lead frame forming a drain connection from the power semiconductor to the first circuit board; and
a housing which borders at least regions of a fluid reservoir accommodating a coolant fluid;
wherein the power semiconductor and the lead frame are arranged in the fluid reservoir and configured to transfer heat to the coolant fluid.

2. The power electronics device according to claim 1, further comprising:
a further power semiconductor; and
a further lead frame connecting the further power semiconductor and the first circuit board;
wherein the further power semiconductor is connected to at least one contacting region of the further lead frame in such a way that heat can be transferred from the further power semiconductor to the further lead frame and is conducted away from the further lead frame by the further power semiconductor;
wherein the further power semiconductor and the further lead frame are arranged on an opposite side of the first circuit board than the power semiconductor and the lead frame.

3. The power electronics device according to claim 2, wherein the first circuit board is electrically coupled to a second circuit board, and wherein the first circuit board with the power semiconductors and lead frames arranged thereon is positioned in such a way that the further lead frame has a spacing from the second circuit board.

4. The power electronics device according to claim 1, wherein line elements of the lead frame form a total heat transfer surface for transferring heat to the coolant fluid, wherein an area of the total heat transfer surface is greater than an area of a connection surface of the lead frame on which the lead frame contacts the power semiconductor.

5. The power electronics device according to claim 1, wherein a plane of attachment of the lead frame to the power semiconductor has a spacing from the first circuit board.

6. The power electronics device according to claim 1, further comprising a condensing unit configured to cool and thus condense vaporized coolant fluid and in turn to provide the cooled and condensed coolant fluid for cooling at least one of the power semiconductor or the lead frame, wherein the condensing unit is disposed within the housing and above the lead frame.

7. The power electronics device according to claim 6, wherein the condensing unit has a receiving space and a cooling medium accommodated in the receiving space, the condensing unit being configured to absorb heat from vaporized coolant fluid and transfer the absorbed heat to the cooling medium in the receiving space.

8. The power electronics device according to claim 7, wherein the condensing unit has projections extending towards the fluid reservoir, wherein the receiving space extends at least partially into the projections.

9. A motor vehicle having an electric motor, comprising a power electronics device according to claim 6, and a cooling medium circuit which is fluidically coupled to the condensing unit of the power electronics device.

10. A power electronics functional system, comprising a plurality of power electronics devices according to claim 1, wherein the power electronics devices are connected to lines for different voltage phases.

11. The power electronics device of claim 1, comprising a snubber capacitor arranged on and connected to the first circuit board, wherein the snubber capacitor is arranged in the fluid reservoir and configured to transfer heat to the coolant fluid.

12. A power electronics device, comprising:
a circuit board;
a housing, at least partially, defining a fluid reservoir;
a power semiconductor disposed in the fluid reservoir, the power semiconductor being a switching device;
a lead frame disposed in the fluid reservoir, the lead frame being connected to the power semiconductor and the circuit board, wherein the power semiconductor is disposed between the circuit board and the lead frame, wherein the power semiconductor is directly connected to the circuit board and the lead frame on opposing sides of the power semiconductor, the power semiconductor being configured to transfer heat directly to the circuit board and the lead frame, the lead frame forming a drain connection from the power semiconductor to the circuit board; and
a coolant fluid housed in the fluid reservoir, the coolant fluid surrounding the power semiconductor and the lead frame in the fluid reservoir.

13. The power electronics device of claim 12, wherein the circuit board, at least partially, defines the fluid reservoir, wherein a top surface of the circuit board defines a bottom of the fluid reservoir, wherein the power semiconductor and the lead frame are connected to the top surface of the circuit board.

14. The power electronics device of claim 12, wherein the circuit board is disposed in the fluid reservoir.

15. The power electronics device of claim 12, further comprising:
a further power semiconductor disposed in the fluid reservoir; and a further lead frame disposed in the fluid reservoir, the further lead frame connecting the further power semiconductor to the circuit board;
wherein the coolant fluid surrounds the further power semiconductor and the further lead frame in the fluid reservoir.

16. The power electronics device of claim 15, wherein the further power semiconductor and the further lead frame are arranged on an opposite side of the circuit board than the power semiconductor and the lead frame.

17. The power electronics device of claim 11, further comprising a further circuit board supporting the housing, the further circuit board, at least partially, defining the fluid reservoir, wherein the power semiconductor, the circuit board, and the lead frame are spaced from the further circuit board.

18. The power electronics device of claim 12, wherein a plane of attachment of the lead frame to the power semiconductor has a spacing from the circuit board.

19. The power electronics device of claim 12, further comprising a condensing unit disposed within the housing, the condensing unit being configured to cool vaporized coolant fluid received from the fluid reservoir and to provide condensed coolant fluid to the fluid reservoir.

20. The power electronics device of claim 12, the power semiconductor is configured to transfer heat to at least one of the coolant fluid or the lead frame, and the lead frame is configured to transfer heat to the coolant fluid.

* * * * *